(12) United States Patent
Ramachandran (10) Patent No.: US 6,674,999 B2
(45) Date of Patent: Jan. 6, 2004

(54) DYNAMICALLY VARYING LINEARITY SYSTEM FOR AN RF FRONT-END OF A COMMUNICATION DEVICE

(75) Inventor: Balasubramanian Ramachandran, Irvine, CA (US)

(73) Assignee: Skyworks Solutions, Inc, Irvine, CA (US)

(*) Notice: Subject to any disclaimer, the term of this patent is extended or adjusted under 35 U.S.C. 154(b) by 282 days.

(21) Appl. No.: 09/811,082

(22) Filed: Mar. 16, 2001

(65) Prior Publication Data

US 2002/0159503 A1 Oct. 31, 2002

(51) Int. Cl.[7] .................................................. H04Q 7/20
(52) U.S. Cl. ........................ 455/115; 455/127; 455/522
(58) Field of Search ............................... 455/115, 127, 455/126, 91, 160.1, 161.2, 552, 553, 180.1, 426, 522, 551, 423, 69, 67.1, 574; 370/468, 470, 471, 441, 233, 234, 342

(56) References Cited

U.S. PATENT DOCUMENTS

| | | | | | |
|---|---|---|---|---|---|
| 5,530,923 | A | * | 6/1996 | Heinonen et al. | 455/126 |
| 5,548,616 | A | * | 8/1996 | Mucke et al. | 330/129 |
| 5,590,402 | A | * | 12/1996 | Samson et al. | 455/119 |
| 5,757,858 | A | * | 5/1998 | Black et al. | 341/68 |
| 5,771,442 | A | * | 6/1998 | Wang et al. | 332/119 |
| 5,844,979 | A | * | 12/1998 | Raniere et al. | 348/14.08 |
| 5,887,020 | A | | 3/1999 | Smith et al. | |
| 5,930,683 | A | * | 7/1999 | Plocher | 455/62 |
| 6,070,058 | A | * | 5/2000 | Waldroup et al. | 455/126 |
| 6,088,399 | A | * | 7/2000 | Luz et al. | 375/140 |
| 6,091,759 | A | * | 7/2000 | Rotstein et al. | 370/310 |
| 6,097,716 | A | * | 8/2000 | Abrishamkar | 370/342 |
| 6,125,103 | A | * | 9/2000 | Bauml et al. | 370/203 |
| 6,128,322 | A | * | 10/2000 | Rasanen et al. | 370/335 |
| 6,259,928 | B1 | * | 7/2001 | Vembu | 455/522 |
| 6,317,607 | B1 | * | 11/2001 | Tomcik et al. | 455/414 |
| 6,373,823 | B1 | * | 4/2002 | Chen et al. | 370/252 |
| 6,524,206 | B2 | | 2/2003 | Tsunemi et al. | |

* cited by examiner

Primary Examiner—Nay Maung
Assistant Examiner—Jean A Gelin
(74) Attorney, Agent, or Firm—The Eclipse Group; Francisco Rubio-Campos (57) ABSTRACT

A dynamically varying linearity system "DVLS" capable of varying the linearity of a radio frequency (RF) front-end of a communication device responsive to receiving a condition signal indicating a desired mode of operation of a transmitter. The DVLS may include a condition signal indicative of the desired mode of operation and a controller that adjusts the linearity of the transmitter responsive to the condition signal. The condition signal may be responsive to a user interface. The controller, responsive to the condition signal, may dynamically adjust the operating current of the transmitter.

58 Claims, 4 Drawing Sheets

DYNAMICALLY VARYING LINEARITY SYSTEM FOR AN RF FRONT-END OF A COMMUNICATION DEVICE

BACKGROUND OF THE INVENTION

1. Technical Field

This invention relates to a radio frequency (RF) front-end of a communication device and, in particular, to a system for varying the linearity of the RF front-end transmitter.

2. Related Art

In today's society the presence and utilization of telecommunication systems is increasing at a rapid pace. Wireless and broadband systems and infrastructures continue to grow resulting in crossover between both types of systems. As such, wireless systems utilizing third generation "3G" wireless standards (such as Code Division Multiple Access "CDMA" 2000 (a IS-95 based system), wideband CDMA "WCDMA," frequency division duplex "FDD" and time division duplex approaches "TDD," time Division-Spatial CDMA "TD-SCDMA" and others may be configured to handle a number of diverse applications other than voice transmission.

A few of these diverse applications may include low, medium and high data rate applications, such as, for example, e-mail, text, video and streaming applications. These communication devices may be configured to handle multiple modes of operation, including, without limitation, voice, low data rate, medium data rate, and high data rate modes of operation.

Each of these modes of operation may impose widely differing processing and/or transmitter requirements on the communication device. For example, the peak-to-average ratio, or crest factor, of the modulated baseband signal varies widely depending upon the nature of modulation, coding schemes, band-limited filtering employed, and the mode of operation. These different crest factors result in different linearity requirements for the RF front-end of a transmitter. The linearity requirements are important because of the stringent adjacent channel power/leakage specification requirements of many typical standards that should be met by the mobile transmitter. These specifications attempt to limit interference to other users in CDMA systems and thus increase the overall network capacity. To limit the adjacent channel interference to typically acceptable specification values, the transmitter front-end should be highly linear. This high linearity in turn determines the operating current for the RF front-end of the transmitter.

Unfortunately, energy is expensive and at times in short supply. Modern communication devices such as radios, televisions, stereos and computers consume a significant amount of power that translates into expensive electrical costs. Additionally, current mobile wireless devices (also known as mobile units) such as cellular telephones, portable televisions, portable radios, personal communication devices, pagers and satellites operate on battery power and thus have limited battery time. Limited battery time translates into limited continuous operation time.

In a multi-mode transmitter such as a transmitter configured to handle voice, low data rate, medium data rate, and high data rate applications, the conventional approach is to configure the transmitter for the application that imposes the most stringent linearity requirement on the system such as high data rate transmission. This approach results in excessive operating current in the other modes of operation. Because of the excessive operating current, the battery life, and hence talk-time, of the communication device will be decreased. Reduced talk-time in turn results in lower battery life and the necessity for frequent charging of the mobile communication device. Therefore, there is a need for a system that reduces the amount of power required by the RF front-end transmitter of a communication device.

SUMMARY

This invention is a dynamically varying linearity system "DVLS" capable of varying the linearity of a radio frequency (RF) front-end of a communication device. As an example of operation, the DVLS would receive a condition signal indicating a desired mode of operation of a transmitter and the DVLS would adjust the linearity of the transmitter responsive to the mode of operation.

As an example implementation of the DVLS architecture, the DVLS may include a condition signal indicative of the desired mode of operation and a controller that adjusts the linearity of the transmitter responsive to the condition signal. The condition signal may be responsive to a user interface. The controller, responsive to the condition signal, may dynamically adjust the operating current of the transmitter. Additionally, the operating current of the transmitter may be set at a default level optimized for a certain mode of operation. The operating current of the transmitter may then be reduced from the default level for other modes of operation.

In one example implementation, the controller is capable of selecting a voice transmission mode, a low data-rate transmission mode, a medium data-rate transmission mode, and/or a high data-rate transmission mode. The selected mode, in combination with the desired transmit power, sets the operating current of the RF front-end of the transmitter. In another example implementation, a signal representative of the desired transmit power is provided externally, such as from a base station in communication with a mobile unit containing the transmitter, and exercising closed loop power control over the mobile unit. In this implementation, the base station exercises closed loop power control by first receiving a signal from the mobile unit, and then directing the mobile unit to either increase or decrease its transmission power in order to achieve a desired ratio of $E_b/N_o$. The mobile unit measures the received power from the base station and this value in turn determines the transmitted power of the mobile unit.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION OF THE PREFERRED EMBODIMENTS

Figure 1:
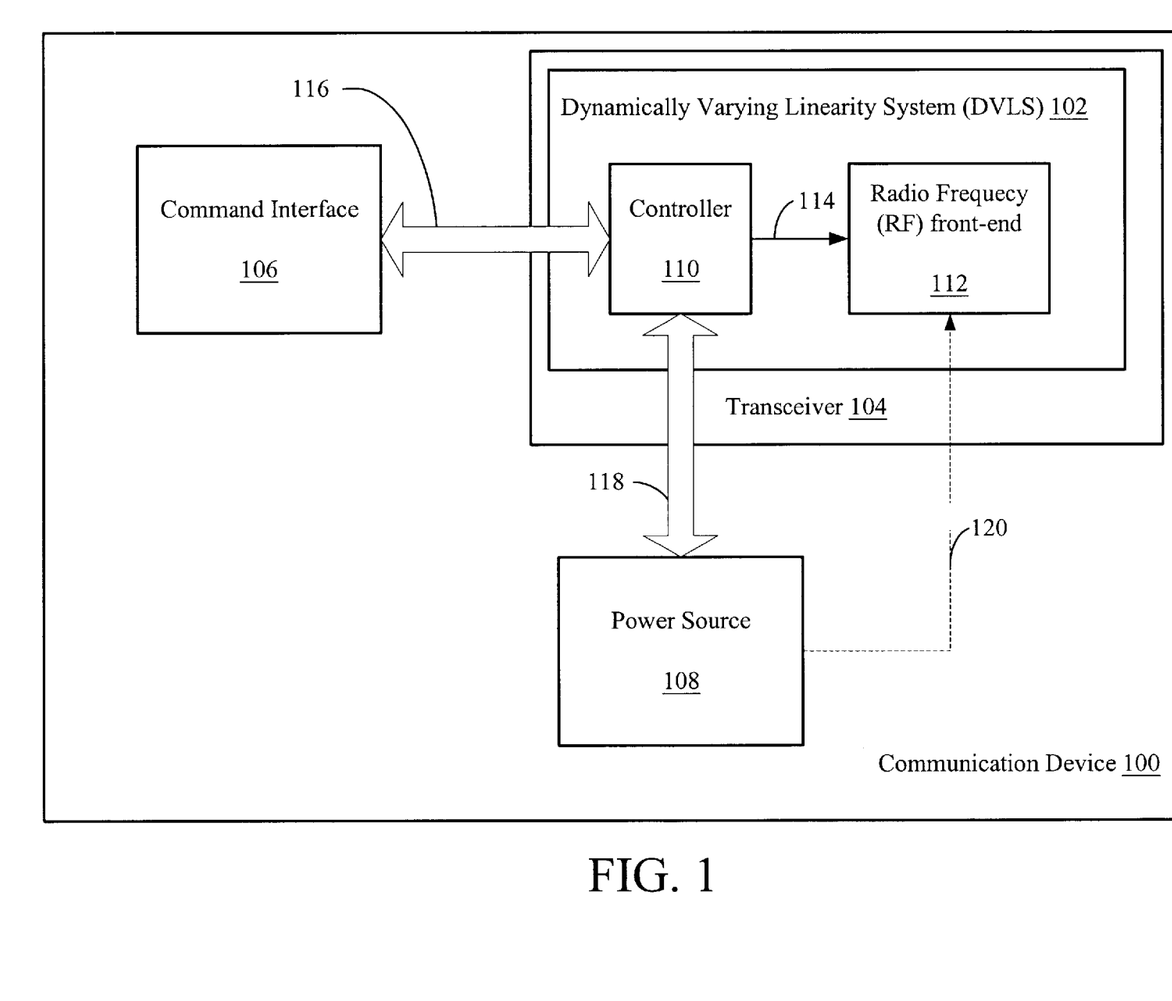
FIG. 1 is a block diagram of an example implementation of a dynamically varying linearity system "DVLS" within a communication device.

FIG. 1 is a block diagram of a communication device 100. The communication device 100 includes an example implementation of a dynamically varying linearity system "DVLS" 102 within a transceiver 104, a command interface 106 and a power source 108. The DVLS 102 includes a controller 110 and a radio frequency (RF) front-end 112. The transceiver 104 is connected to the command interface 106 and the power source 108. The controller 110 is connected to the RF front-end 112, via signal path 114, command interface 106, via signal path 116, and power source 108 via signal path 118.

The transceiver 104 is a standard type communication device that includes both a receiver (not shown) to receive signals within a first frequency band (i.e., bandwidth), and transmitter (not shown) to transmit other signals within a second frequency band. It is appreciated by those skilled in the art that the first frequency band and second frequency band may be either different frequency bands or the same frequency band based on the desired application of the transceiver 104. The transceiver 104 may be a transceiver in a wireless communication device (also known as a "mobile device" or "mobile unit") such as a cellular telephone, two-way radio, two-way pager, a satellite, personal digital assistant "PDA" and other personal communication devices. Additionally, it is also appreciated that the DVLS 102 may also utilize a transmitter (not shown) without a receiver instead of the transceiver 104. In this case, the transmitter may be a transmitter in any one-way communication device such as a television, one-way radio, one-way pager, one-way PDA, or other similar device.

The command interface 106 receives a command from an external source such as a user (not shown) or base station (not shown) and produces a condition signal indicative of a desired mode of operation. The command interface 106 may be designed for utilization of the DVLS 102 in a specific field environment. In one example application, the RF front-end 112 is part of a multi-mode transmitter, and the linearity of this RF front-end 112 is varied depending upon the selected mode and the desired operating power of the transmitter or transceiver 104. Because the operating current may be dynamically varied, it need not be set at the level required for the mode with the highest crest ratio. Consequently, battery life, and hence talk-time, may be conserved.

The controller 110 is any type of control device that may be selectively implemented in software, hardware (such as a computer, processor, micro controller or the equivalent), or a combination of hardware and software. The controller 110 receives the condition signal from the command interface 106 via signal path 116. The controller 110 varies and/or adjusts the RF front-end 112, via signal path 114, in response to the condition signal from the command interface 106. The controller 110 may vary and/or adjust the RF front-end 112 by varying and/or adjusting a current supplied to the RF front-end 112 from the power source 108. As an example, when the controller 110 receives the condition signal indicating a desired mode of operation, the controller 110 increases the amount of current supplied from the power source 108 to the RF front-end 112 to a current level above a predetermined current level. When the controller 110 later receives the condition signal indicating a different desired mode of operation, the controller 110 then decreases the amount of current supplied from the power source 108 to the RF front-end 112 back to the predetermined current level. Additionally, if the different modes of operation are known, the controller 110 may set the amount of current supplied from the power source 108 to the RF front-end 112 to a second predetermined current level based on a lookup table "LUT" (not shown) or processor unit (not shown) located either in or external to the controller 110.

The controller 110 may be connected to the power source 108 directly via signal path 118 such that the current from the power source 108 travels from the power source 108 through the signal paths 118 and 114 and the controller 110 to the RF front-end 112. Alternatively, the power source 108 may be directly connected to the RF front-end 112 via optional signal path 120. In this example implementation, the controller 110 communicates control information to the power source 108 via signal path 118 and the power source 108 directly varies the current output to the RF front-end 112 via optional signal path 120.

The power source 108 is a standard power supply. In wireless applications the power source 108 may be a battery in a cellular telephone or radio. In non-wireless applications the power source 108 may be a power supply connected to a standard power line. The power source 108 may be a variable power source capable of having its output power varied by an input command or feedback from the communication device 100. Alternatively, the power source 108 may be non-variable and the controller 110 may include power-varying circuitry capable of varying the power received from the power source 108 and outputting the resulting varied power to the RF front-end 112 via signal path 114.

As an example of operation of the communication device 100, the controller 110 is capable of selecting the mode of operation of the RF front-end 112 and is coupled to the power source 108. The controller 110 determines the mode of operation of the RF front-end 112 responsive to a command received from the command interface 106 via signal path 116. As an example, the controller 110 is capable of selecting voice transmission mode, low data-rate transmission mode, medium data-rate transmission mode and high data-rate transmission mode. The selected mode is then transmitted from the controller 110 to the power source 108 via signal path 118.

Additionally, the controller 110 may also transmit, via signal path 118, to the power source 108 a desired power level command that may be independent of the selected mode. This desired power level command is received from the command interface 106 and may be the result of an input device or feedback control (not shown). As an example, the desired power level command may occur in transmissions to and/or from a base station (not shown) in communication with a mobile communication device, such as the communication device 100, and exercising closed loop power control over the mobile communication device. In this example, the base station exercises closed loop power control by first receiving a signal from the communication device 100, and then, after analyzing the signal to determine its $E_b/N_0$ ratio, directing the communication device 100 to either increase or decrease its transmission power in order to achieve a desired ratio of $E_b/N_o$.

The command interface 106 receives an input from a user (not shown) indicative of the selected mode of operation and/or a signal representative of the desired transmit power from the base station (not shown). In response, the command interface 106 sends the controller 110, via signal path 116, a mode of operation signal and/or a desired power level command. The controller 110 then outputs a corresponding operating current, via signal path 114, to the RF front-end 112. Alternatively, the controller 110 may send a control signal, via signal path 118, to the power source 108 that in response outputs a corresponding operating current, via optional signal path 120, to the RF front-end 112. The controller 110 may include a processor for determining the corresponding operating current in software or, alternatively, may include hardware for performing this function.

The controller 110 may include software or hardware capable of receiving a mode selection signal from the command interface 106, via signal path 116, and determining a base linearity for the RF front-end 112. The determination may further include accessing a LUT (not shown) that associates each of the selected modes of operation with an associated crest factor and a second LUT for determining the base linearity associated with the crest factor. The base linearity may be represented by a voltage signal that ranges from 0.5 to 2.5 volts. The controller 110 may also receive the desired transmit power level command from the command interface 106 and adjust the previously determined base linearity in response to the received desired transmit power level command. The desired transmit power level command is a signal that corresponds to the desired power level of operation for the transmitter portion of transceiver 104 that may range from −50 dBm to 23 dBm. It is appreciated that this range may vary in different systems such as IS-95-A versus WCDMA by some amount but generally the range is in the order of 80–90 dB. The controller 110 then outputs a corresponding operating current for the RF front-end 112. Alternatively, the controller 110 may send a command signal, via signal path 118, to the power source 108, which then outputs a corresponding operating current for the RF front-end 112, via optional signal path 120, in response to the command signal.

The RF front-end 112 of the transceiver 104 operates responsive to the operating current output from the controller 110. In an example implementation, the transmitter portion (not shown) of the transceiver 104 is a super-heterodyne transmitter, and the output of the controller 110 or the power source 108 drives the UHF mixer and pre-amplifier of the transmitter, the other components of which may be driven by a fixed power source (not shown).

Figure 2:
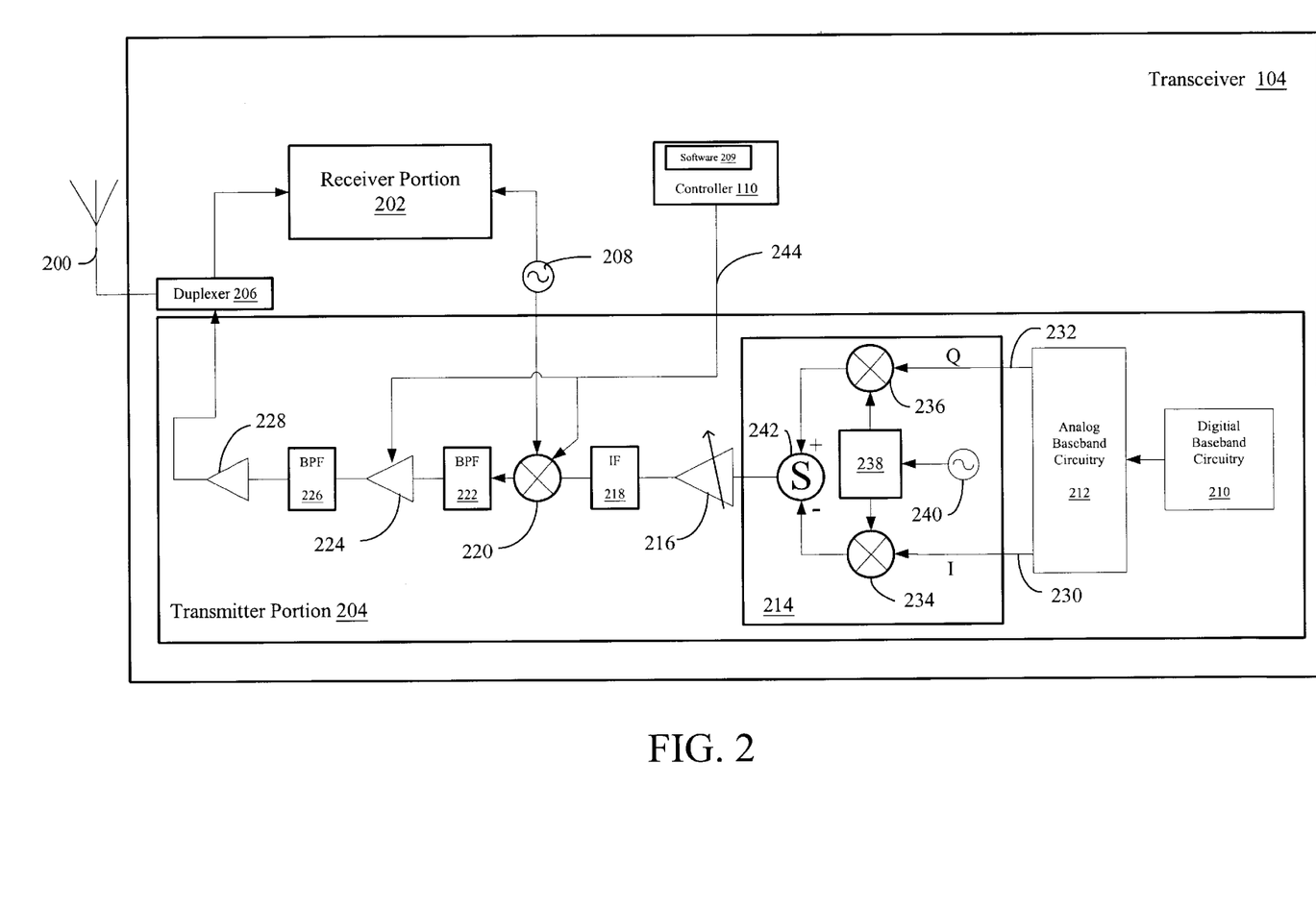
FIG. 2 is a block diagram of the transceiver block of the DVLS shown in FIG. 1.

FIG. 2 illustrates an example implementation of the transceiver 104 block shown in FIG. 1 connected to an antenna 200. In this example implementation, the transceiver 104 includes a receiver portion 202, transmitter portion 204, duplexer 206, a first frequency source 208 and controller 110 having software 209. The receiver portion 202 and transmitter portion 204 are both electrically connected to the duplexer 206. The duplexer 206 allows simultaneous reception and transmission over antenna 200 by both the receiver portion 202 and transmitter portion 204. The first frequency source 208 is electrically connected to both the receiver portion 202 and transmitter portion 204. The first frequency source 208 is a standard frequency device such a local oscillator, frequency synthesizer, or other similar frequency device.

The transmitter portion 204 may utilize a super-heterodyne transmitter where a baseband signal is first modulated up to an intermediate UHF frequency, and then the intermediate frequency signal is modulated up to the desired VHF transmit frequency. The transmitter portion 204 may include digital baseband circuitry 210, analog baseband circuitry 212, quadrature modulator 214, automatic gain control "AGC" amplifier 216, intermediate frequency "IF" filter 218, mixer 220, image reject bandpass filter "BPF" 222, pre-driver amplifier 224, BPF 226 and power amplifier 228.

The quadrature modulator 214 is electrically connected to the controller 110 and AGC amplifier 216. The AGC amplifier 216 is electrically connected to IF filter 218. The IF filter 218 is electrically connected to mixer 220. Mixer 220 is electrically connected to both the first frequency source 208 and image reject BPF filter 222. Image reject BPF filter 222 is electrically connected to pre-driver amplifier 224. The pre-driver amplifier 224 is electrically connected to BPF filter 226. BPF filter 226 is electrically connected to power amplifier 228. The power amplifier 228 is electrically connected to duplexer 206.

The digital baseband circuitry 210 may originate a digital baseband signal. In the case of applications involving low, medium, or high data rate transmission, the digital baseband circuitry 210 might be a modem that provides data originating from a PC. In the case of applications involving voice transmission, the digital baseband circuitry 210 might consist of a microphone followed by a vocoder for coding speech.

Analog baseband circuitry 212 receives the digital baseband signal and produces an analog complex baseband signal having in-phase (i.e., I channel) 230 and out-of-phase (i.e., quadrature "Q" channel) 232 components. Analog baseband circuitry 212 may be followed by the quadrature modulator 214 that modulates the analog baseband signal to a VHF intermediate frequency utilizing an in-phase mixer 234, out-of-phase mixer 236, 90° phase shifter 238, second frequency source 240 and combiner 242. The quadrature modulator 214 is followed by AGC amplifier 216 that may provide a variable linear power output at the antenna 200 for closed loop power control inherent in CDMA direct sequence spread spectrum "DSSS" systems.

The IF filter 218 follows the AGC amplifier 216. The IF filter 218 reduces the out-of-band noise (especially the receiver band noise "RX band noise" in full duplex systems like IS-95 CDMA, WCDMA (FDD)) and spurious signals. The IF filter 218 is followed by mixer 220 that modulates the IF signal up to the desired transmit frequency (i.e., a second frequency band), such as ultra high frequency "UHF" or radio frequency "RF" utilizing the first frequency source 208. The output from mixer 220 is processed by image reject BPF 222. The BPF 222 rejects the image frequency (such as higher order harmonics) from the signal output from mixer 220, and passes or substantially passes the entire range of transmit frequencies. At the same time, the BPF 222 attenuates the RX band noise generated by the mixer 220. It is appreciated that a BPF 222 is not necessary in certain architectures where an image reject mixer configuration is utilized.

The pre-driver amplifier 224 follows the image reject BPF 222. The pre-driver amplifier 224 boosts the level of the transmit signal from the image reject BPF 222 to a level high enough to drive the power amplifier 228. The BPF 226 follows the pre-driver amplifier 224. The BPF 226 passes the entire range or substantially the entire range of transmit frequencies, but attenuates harmonic frequencies generated by the pre-driver amplifier 224. The BPF 226 is configured to have low loss at transmit frequencies, but high attenuation at harmonic frequencies and at frequencies in the receiver band. As an example, the BPF 226 may be a ceramic or surface acoustic wave "SAW" filter. The power amplifier 228 follows the BPF 226. The power amplifier 228 boosts the level of the transmit signal to the desired output power and sends the signal to the antenna 200 via the duplexer 206.

In this implementation example, the controller 110 sets the operating current for mixer 220 and pre-driver 224 via signal path 244. The controller 110 determines the operating current by accessing two lookup tables "LUTs" preferably located within the controller 110. The first LUT associates each possible selected mode with a crest factor. The second LUT associates each possible crest factor with a required base linearity.

Figure 3:
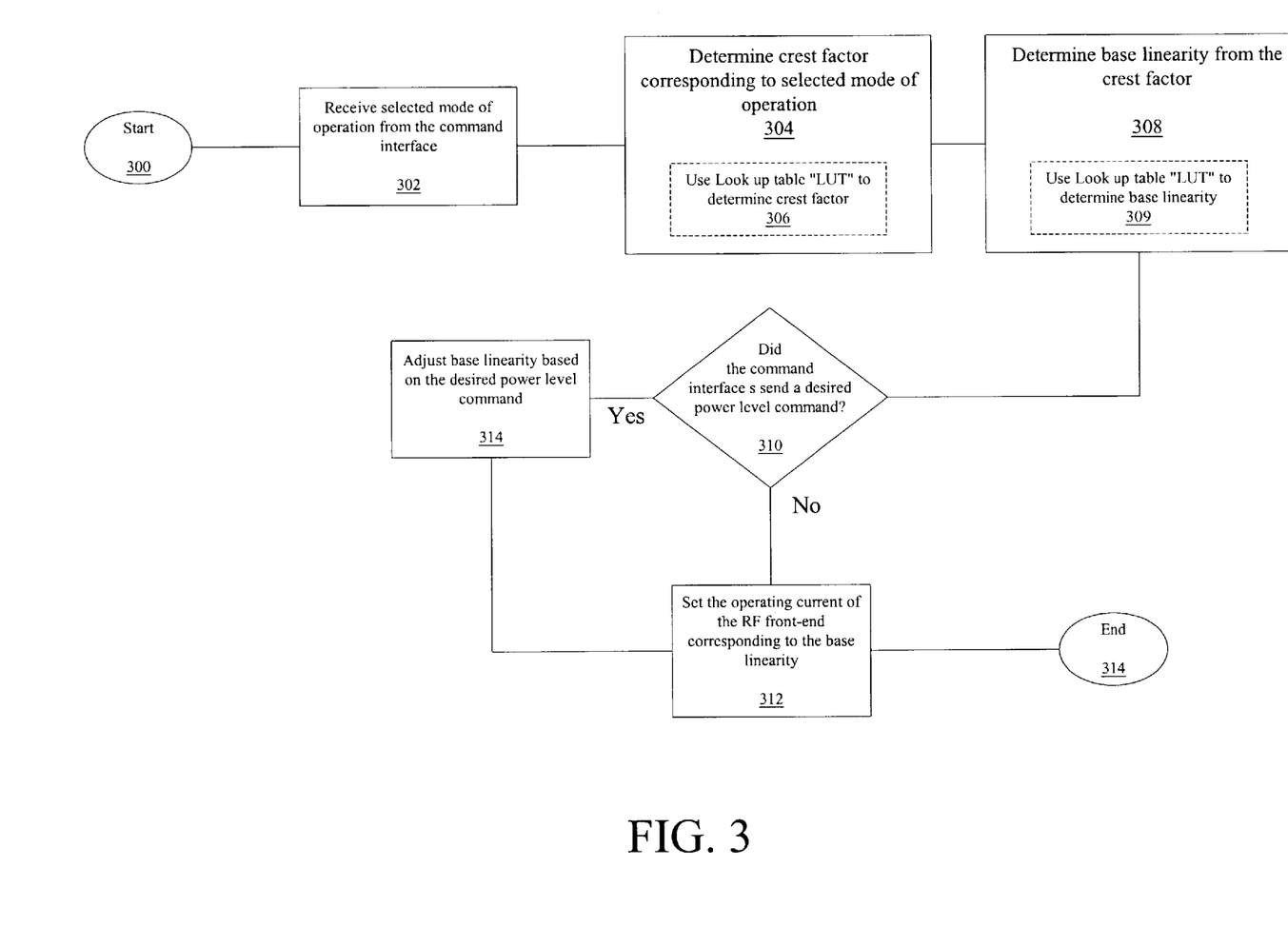
FIG. 3 is a flow chart illustrating an example process performed by the DVLS of FIG. 1.

FIG. 3 is a flow chart illustrating an example process performed by the DVLS 102 of FIG. 1. In general, the example process includes setting a base linearity responsive to a selected mode of operation. Adjusting the base linearity responsive to a desired transmit power and setting the operating current of at least a portion of a RF front-end 112, FIG. 1, responsive to the adjusted base linearity. In one example implementation, the operating current is for driving one or more components of the RF front-end 112.

The process begins in step 300, FIG. 3, and continues to step 302. In step 302, the controller 110, FIG. 1, receives a signal from the command interface 106 indicating the mode of operation for the RF front-end 112. The controller 110 then determines a crest factor corresponding to the selected mode of operation in step 304, FIG. 3. The determination may be accomplished by utilizing a LUT in step 306. The process then continues to step 308. In step 308, the controller 110, FIG. 1, determines the base linearity corresponding to the crest factor and the process continues to decision step 310, FIG. 3. Similar to step 306, the determination may be accomplished by utilizing a second LUT in optional step 309 or utilizing a computation circuit (not shown) that generates a real-time value of the base linearity corresponding to the crest factor. It is appreciated that the base linearity associated with the crest factor could be determined in a variety of ways. As an example, one method would be to assume a default that would cater to the specifications and then set the base linearity to that value. When the actual power to be transmitted is known, via the base station and the receiver estimation, the base linearity value could be changed to reflect the new value. Another alternative example solution is to dynamically set the base linearity from the initial estimate of the transmitter power.

In decision step 310, the controller 110, FIG. 1, determines whether it received a desired power level command from the command interface 106. If the controller 110 received a desired power level command from the command interface 106, the process continues to step 312, FIG. 3. In step 312, the controller 110, FIG. 1, adjusts the base linearity in response to the desired power level command and sets the operating current of the RF front-end 112 corresponding to the base linearity in step 314, FIG. 3. The operating current is for driving one or more components of the RF front-end 112, FIG. 1. The process then ends in step 316, FIG. 3.

If instead the controller 110, FIG. 1, did not receive a desired power level command from the command interface 106, the process continues to step 314, FIG. 3. In step 314, the controller 110, FIG. 1, sets the operating current of the RF front-end 112 corresponding to the base linearity and the process ends in step 316, FIG. 3.

It is appreciated that the controller 110, FIG. 1, may be selectively implemented in software, hardware, or a combination of hardware and software. For example, the elements of the controller 110 may be implemented in software 209, FIG. 2, stored in a memory located (not shown) in a controller 110. The software 209 configures and drives the controller 110 and performs the process illustrated in FIG. 3.

The software 209 includes an ordered listing of executable instructions for implementing logical functions. The software 209 may be embodied in any computer-readable medium, or computer-bearing medium, for use by or in connection with an instruction execution system, apparatus, or device, such as a computer-based system, processor-containing system, or other system that may selectively fetch the instructions from the instruction execution system, apparatus, or device and execute the instructions. In the context of this document, a "computer-readable medium" is any means that may contain, store, communicate, propagate, or transport the program for use by or in connection with the instruction execution system, apparatus, or device. The computer readable medium may be, for example, but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a RAM (electronic), a read-only memory "ROM" (electronic), an erasable programmable read-only memory (EPROM or Flash memory) (electronic), an optical fiber (optical), and a portable compact disc read-only memory "CDROM" (optical).

An example implementation of the process described in FIG. 3 may employ at least one computer-readable signal-bearing medium (such as the Internet, magnetic storage medium, such as floppy disks, or optical storage, such as compact disk (CD/DVD), biological, or atomic data storage medium). In yet another example implementation, the computer-readable signal-bearing medium comprises a modulated carrier signal transmitted over a network comprising or coupled with a diversity receiver apparatus, for instance, one or more telephone networks, a local area network, the Internet, and wireless network. An exemplary component of such embodiments is a series of computer instructions written in or implemented with any number of programming languages. Note that the computer-readable medium may even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Figure 4:
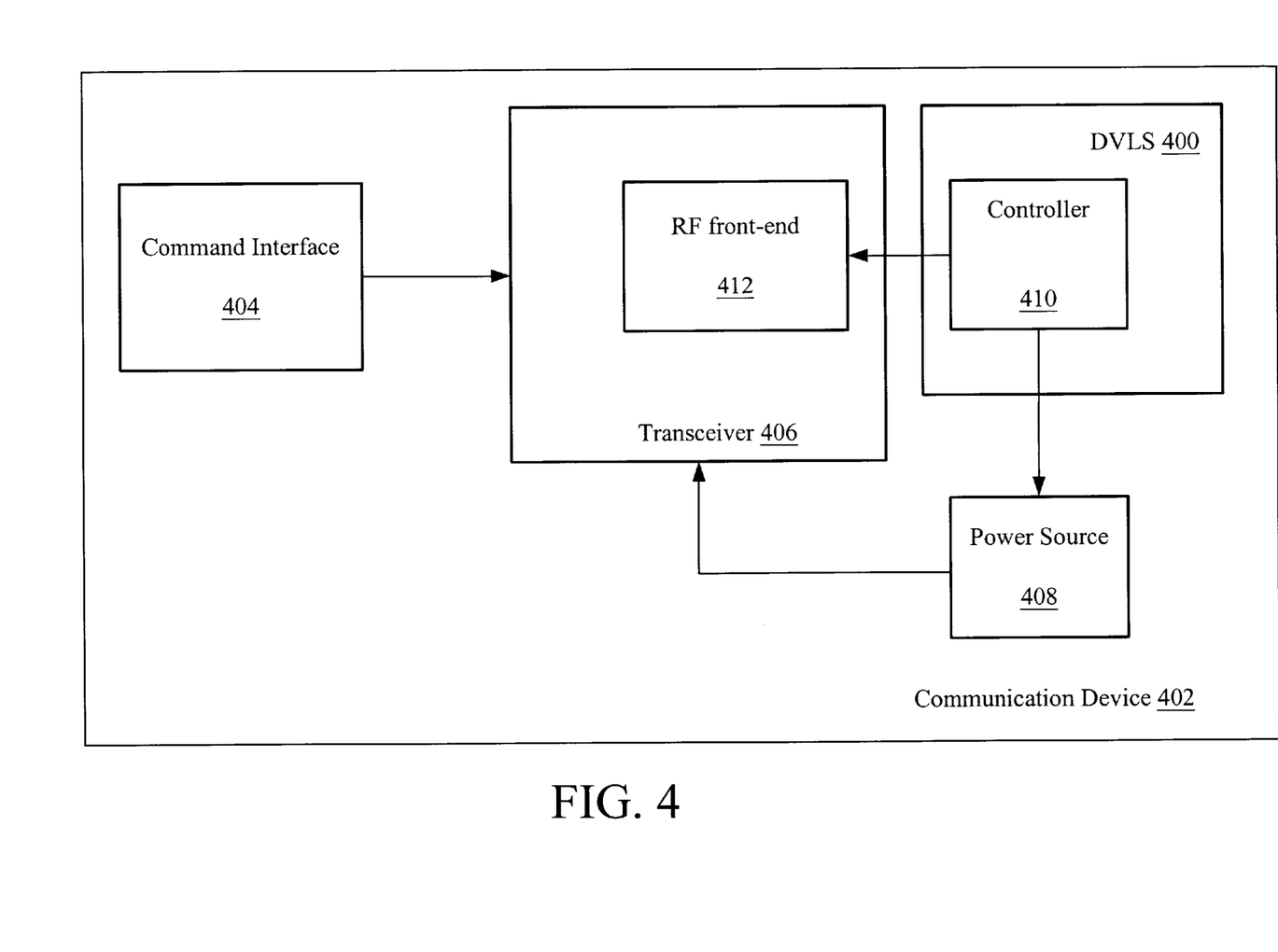
FIG. 4 is a block diagram of another example implementation of the DVLS.

FIG. 4 is a block diagram of another example implementation of a DVLS 400 within a communication device 402. The communication device 402 includes the DVLS 400, a command interface 404, a transceiver 406 and a power source 408. The DVLS 400 includes a controller 410 and the transceiver 406 includes a RF front-end 412. In this example implementation, the DVLS 400 is electrically connected to the command interface 404 and the power source 408. The DVLS 400 is also electrically connected externally to the transceiver 406. It is appreciated that the DVLS 400 operates in a manner similar to the DVLS 102, FIG. 1, except that DVLS 400, FIG. 4, is external to the transceiver 406.

While various embodiments of the application have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A communication device having a system for dynamically varying the operating current of at least part of a multi-mode transmitter comprising:
a mode selector for selecting a mode of operation of the multi-mode transmitter, wherein the mode selector is configured to select a mode responsive to a command received over a user interface; and
a controller that adjusts the operating current of at least part of the multi-mode transmitter responsive to the mode selector, the controller further including first, second, and third sub-modules, wherein
the first sub-module is configured to determine a base linearity responsive to the selected mode, where the base linearity is responsive to a crest factor associated with the selected mode,
the second sub-module is configured to adjust the base linearity responsive to a desired transmit power, and
the third sub-module is configured to determine the operating current responsive to the adjusted base linearity.

2. The communication device of claim 1 wherein the mode selector is configured to select a mode from the following group: voice transmission, low data rate transmission, medium data rate transmission, and high data rate transmission.

3. The communication device of claim 1 wherein the first sub-module is configured to determine the base linearity responsive to accesses to first and second lookup tables, where the first lookup table associates a crest factor with each possible selected mode, and the second lookup table associates a required base linearity with each possible crest factor.

4. The communication device of claim 1 wherein the multi-mode transmitter is a spread spectrum transmitter.

5. The communication device of claim 4 wherein the spread spectrum transmitter is a code division multiple access transmitter.

6. The communication device of claim 4 wherein the spread spectrum transmitter has a radio frequency front end and the controller is configured to dynamically determine the operating current for at least part of the radio frequency front end.

7. The communication device of claim 6 wherein the radio frequency front end of the spread spectrum transmitter includes an ultra high frequency mixer and a pre-driver amplifier, and the controller is configured to dynamically determine the operating current of the ultra high frequency mixer and the pre-driver amplifier.

8. The communication device of claim 1 wherein the communication device is a mobile unit.

9. The communication device of claim 8 wherein the desired transmit power of the multi-mode transmitter is determined by a base station in communication with the mobile unit and exercising closed loop power control over the mobile unit.

10. The communication device of claim 8 wherein the mobile unit is a cellular telephone.

11. A system comprising:
a mode selector for selecting a mode of operation of a transmitter; and
a controller that adjusts the operating current of at least part of the transmitter responsive to the mode selector, wherein the controller includes first, second, and third sub-modules, wherein the first sub-module is configured to determine a base linearity responsive to the selected mode, the second sub-module is configured to adjust the base linearity responsive to a desired transmit power, and the third sub-module is configured to determine the operating current responsive to the adjusted base linearity.

12. The system of claim 11 wherein the mode selector is configured to select a mode responsive to a command received over a user interface.

13. The system of claim 12 wherein the mode selector is configured to select a mode from the following group: voice transmission, low data rate transmission, medium data rate transmission, and high data rate transmission.

14. The system of claim 11 wherein the first sub-module is configured to determine the base linearity responsive to a crest factor associated with the selected mode.

15. The system of claim 14 wherein the first sub-module is configured to determine the base linearity responsive to accesses to first and second lookup tables, where the first lookup table associates a crest factor with each possible selected mode, and the second lookup table associates a required base linearity with each possible crest factor.

16. The system of claim 11 wherein the transmitter is a spread spectrum transmitter.

17. The system of claim 16 wherein the spread spectrum transmitter is a code division multiple access transmitter.

18. The system of claim 16 wherein the spread spectrum transmitter has a radio frequency front-end and the controller is configured to dynamically determine the operating current for at least part of the radio frequency front end.

19. The system of claim 18 wherein the radio frequency front-end of the spread spectrum transmitter includes an ultra high frequency mixer and a pre-driver amplifier, and the controller is configured to dynamically determine the operating current of the ultra high frequency mixer and the pre-driver amplifier.

20. The system of claim 11 wherein the system is a communication device.

21. The system of claim 20 wherein the communication device is a mobile unit.

22. The system of claim 21 wherein the desired transmit power of the multi-mode transmitter is determined by a base station in communication with the mobile unit and exercising closed loop power control over the mobile unit.

23. The system of claim 21 wherein the mobile unit is a cellular telephone.

24. A communication device having a system for dynamically varying the operating current of at least part of a multi-mode transmitter comprising:
means for selecting a mode of operation of the multi-mode transmitter, wherein the selector means is configured to select a mode responsive to a command received over a user interface; and
means for adjusting the operating current of at least part of the multi-mode transmitter responsive to the selector means, wherein the adjusting means further includes:
means for determining a base linearity responsive to the selected mode, where the base linearity is responsive to a crest factor associated with the selected mode;
means for adjusting the base linearity responsive to a desired transmit power; and
means for determining the operating current responsive to the adjusted base linearity.

25. The communication device of claim 24 wherein the selector means selects a mode from the following group: voice transmission, low data rate transmission, medium data rate transmission, and high data rate transmission.

26. The communication device of claim 24 wherein the determining the base linearity means is responsive to accesses to first and second lookup tables, wherein the first lookup table associates a crest factor with each possible selected mode, and the second lookup table associates a required base linearity with each possible crest factor.

27. A system comprising:
means for selecting a mode of operation of a transmitter; and
means for adjusting the operating current of at least part of the transmitter responsive to the selector means, wherein the adjusting means further includes
means for determining a base linearity responsive to the selected mode,
means for adjusting the base linearity responsive to a desired transmit power, and
means for determining the operating current responsive to the adjusted base linearity.

28. The system of claim 27 wherein the selector means is configured to select a mode responsive to a command received over a user interface.

29. The system of claim 28 wherein the selector means selects a mode from the following group: voice transmission, low data rate transmission, medium data rate transmission, and high data rate transmission.

30. The system of claim 27 wherein the determining means determines the base linearity responsive to a crest factor associated with the selected mode.

31. The system of claim 30 wherein the determining a base linearity means determines the base linearity responsive to accesses to first and second lookup tables, where the first lookup table associates a crest factor with each possible selected mode, and the second lookup table associates a required base linearity with each possible crest factor.

32. The system of claim 27 wherein the transmitter is a spread spectrum transmitter.

33. The system of claim 32 wherein the spread spectrum transmitter is a code division multiple access transmitter.

34. The system of claim 32 wherein the spread spectrum transmitter has a radio frequency front-end and the adjusting means further includes means for dynamically determining the operating current for at least part of the radio frequency front-end.

35. The system of claim 34 wherein the radio frequency front-end of the spread spectrum transmitter includes an ultra high frequency mixer and a pre-driver amplifier, and the adjusting means further includes means for dynamically determining the operating current of the ultra high frequency mixer and the pre-driver amplifier.

36. The system of claim 27 wherein the system is a communication device.

37. The system of claim 36 wherein the communication device is a mobile unit.

38. The system of claim 37 wherein the desired transmit power of the transmitter is determined by a base station in communication with the mobile unit and exercising closed loop power control over the mobile unit.

39. The system of claim 37 wherein the mobile unit is a cellular telephone.

40. A method for dynamically varying the operating current of at least part of a transmitter, the method comprising:
selecting a mode of operation for the transmitter; and
adjusting the operating current of at least part of the transmitter in response to selecting the mode of operation; wherein adjusting further includes
determining a base linearity responsive to the selected mode of operation,
adjusting the base linearity responsive to a desired transmit power, and
setting the operating current responsive to the adjusted base linearity.

41. The method of claim 40 wherein the selecting step further includes selecting the mode from the following group: voice transmission; low data rate transmission; medium data rate transmission; and high data rate transmission.

42. The method of claim 40 wherein the determining step further includes:
determining a crest factor for the selected mode; and
determining the base linearity responsive to the crest factor.

43. The method of claim 40 further comprising applying the operating current to at least part of the transmitter.

44. The method of claim 43 further including applying the operating current to at least part of a radio frequency front-end of the transmitter.

45. A signal-bearing medium having software for dynamically varying the operating current of at least part of a transmitter, the signal-bearing medium comprising:
logic configured to select a mode of operation for the transmitter; and
logic configured to adjust the operating current of at least part of the transmitter in response to selecting the mode of operation; wherein the adjusting logic further includes
logic configured to determine a base linearity responsive to the selected mode of operation;
logic configured to adjust the base linearity responsive to a desired transmit power, and
logic configured to set the operating current responsive to the adjusted base linearity.

46. The signal bearing medium of claim 45 wherein the selecting logic further includes logic configured to select the mode from the following group: voice transmission; low data rate transmission; medium data rate transmission; and high data rate transmission.

47. The signal-bearing medium of claim 45 wherein the determining logic further includes:
logic configured to determine a crest factor for the selected mode; and
logic configured to determine the base linearity responsive to the crest factor.

48. The signal-bearing medium of claim 45 further comprising logic configured to apply the operating current to at least part of the transmitter.

49. The signal-bearing medium of claim 48 further including logic configured to apply the operating current to at least part of a radio frequency front-end of the transmitter.

50. A computer data signal embodied in a carrier wave comprising:
a mode selection source code segment comprising means for selecting a mode of operation for the transmitter; and
an adjustment source code segment comprising means for adjusting the operating current of at least part of the transmitter in response to selecting the mode of operation; wherein the adjustment source code segment further includes
determining source code segment comprising means for determining a base linearity responsive to the selected mode of operation,
adjustment source code segment comprising means for adjusting the base linearity responsive to a desired transmit power, and
setting source code segment comprising means for setting the operating current responsive to the adjusted base linearity.

51. The computer data signal of claim 50 wherein the selecting source code segment further includes a selecting source code segment for selecting the mode from the following group: voice transmission; low data rate transmission; medium data rate transmission; and high data rate transmission.

52. The computer data signal of claim 50 wherein the determining source code segment further includes:
   determining source code segment for determining a crest factor for the selected mode; and
   determining source code segment for determining the base linearity responsive to the crest factor.

53. The computer data signal of claim 52 further including logic configured to apply the operating current to at least part of a radio frequency front-end of the transmitter.

54. A computer-readable medium having software for dynamically varying the operating current of at least part of a transmitter, the computer-readable medium comprising:
   logic configured to select a mode of operation for the transmitter; and
   logic configured to adjust the operating current of at least part of the transmitter in response to selecting the mode of operation; wherein the adjusting logic further includes
      logic configured to determine a base linearity responsive to the selected mode of operation,
      logic configured to adjust the base linearity responsive to a desired transmit power, and
      logic configured to set the operating current responsive to the adjusted base linearity.

55. The computer-readable medium of claim 54 wherein the selecting logic further includes logic configured to select the mode from the following group: voice transmission; low data rate transmission; medium data rate transmission; and high data rate transmission.

56. The computer-readable medium of claim 54 wherein the determining logic further includes:
   logic configured to determine a crest factor for the selected mode; and
   logic configured to determine the base linearity responsive to the crest factor.

57. The computer-readable medium of claim 56 further including logic configured to apply the operating current to at least part of a radio frequency front end of the transmitter.

58. A signal-bearing medium having software for dynamically varying the operating current of at least part of a multi-mode transmitter, the signal bearing medium comprising:
   logic configured to select a mode of operation of the multi-mode transmitter, wherein the selector logic is configured to select a mode responsive to a command received over a user interface;
   logic configured to adjust the operating current of at least part of the multi-mode transmitter responsive to the selector means, wherein the adjusting logic further includes
      logic configured to determine a base linearity responsive to the selected mode, where the base linearity is responsive to a crest factor associated with the selected mode,
      logic configured to adjust the base linearity responsive to a desired transmit power, and
      logic configured to determine the operating current responsive to the adjusted base linearity.

* * * * *